United States Patent
Watanabe et al.

(10) Patent No.: US 10,031,006 B2
(45) Date of Patent: Jul. 24, 2018

(54) SENSOR INCLUDING A PRINTED CIRCUIT BOARD WITH SEMICONDUCTOR PARTS HAVING A FIRST AND SECOND RESIN

(71) Applicant: HITACHI AUTOMOTIVE SYSTEMS, LTD., Ibaraki (JP)

(72) Inventors: Tsubasa Watanabe, Tokyo (JP); Tsutomu Kono, Tokyo (JP); Hiroaki Hoshika, Ibaraki (JP); Takayuki Yogo, Ibaraki (JP); Takahiro Miki, Ibaraki (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/316,981

(22) PCT Filed: Jun. 15, 2015

(86) PCT No.: PCT/JP2015/067110
§ 371 (c)(1),
(2) Date: Dec. 7, 2016

(87) PCT Pub. No.: WO2016/017299
PCT Pub. Date: Feb. 4, 2016

(65) Prior Publication Data
US 2017/0115144 A1  Apr. 27, 2017

(30) Foreign Application Priority Data

Jul. 30, 2014 (JP) .................................. 2014-154430

(51) Int. Cl.
*G01F 1/38* (2006.01)
*H05K 1/18* (2006.01)
(Continued)

(52) U.S. Cl.
CPC .............. *G01F 1/38* (2013.01); *H01L 23/057* (2013.01); *H01L 23/3121* (2013.01);
(Continued)

(58) Field of Classification Search
CPC ................... G06F 1/684; G06F 1/6845; H01L 2224/16225; H01L 2924/15192;
(Continued)

(56) References Cited

U.S. PATENT DOCUMENTS 7,644,615 B2 * 1/2010 Arisaka ................ G01N 27/223
73/335.04
8,324,007 B2 * 12/2012 Ziglioli ............... B81C 1/00309
257/414

(Continued)

FOREIGN PATENT DOCUMENTS

| JP | H08-236560 A | 9/1996 |
|----|--------------|--------|
| JP | 2001-012987 A | 1/2001 |
| JP | 2007-033411 A | 2/2007 |
| JP | 2010-169460 A | 8/2010 |
| JP | 2012-163504 A | 8/2012 |

OTHER PUBLICATIONS

Office Action in JP counterpart Application No. 2016-538207 dated Oct. 31, 2017.

*Primary Examiner* — Harshad R Patel
*Assistant Examiner* — Brandi Hopkins
(74) *Attorney, Agent, or Firm* — Volpe and Koenig, P.C.

(57) ABSTRACT

In a module in which a circuit board is integrally insert molded with a housing while semiconductor parts mounted on the circuit board are exposed, deformation of the circuit board caused by pressure on the circuit board by a mold for blocking the molding resin is reduced. In the module in which the circuit board is integrally insert molded with the housing while the semiconductor parts mounted on the circuit board are exposed, the deformation of the circuit board is reduced by placing a material, which has an elastic (Continued)

modulus smaller than the elastic modulus of the printed circuit board, in the projection area of the mold holding portion on the circuit board.

4 Claims, 15 Drawing Sheets

(51) Int. Cl.
    *H05K 3/28*     (2006.01)
    *H01L 23/31*     (2006.01)
    *H01L 23/498*     (2006.01)
    *H01L 23/057*     (2006.01)
    *H01L 23/00*     (2006.01)

(52) U.S. Cl.
    CPC ....... *H01L 23/49838* (2013.01); *H05K 1/181* (2013.01); *H05K 1/183* (2013.01); *H05K 3/284* (2013.01); *H01L 24/32* (2013.01); *H01L 24/49* (2013.01); *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H05K 2201/10151* (2013.01); *H05K 2203/1316* (2013.01); *H05K 2203/1327* (2013.01)

(58) Field of Classification Search
    CPC .. H01L 2224/8592; H01L 2924/19105; G01B 7/16; G01L 1/18; G01L 1/2293; G01N 27/223; G01N 27/22
    See application file for complete search history.

(56) References Cited

U.S. PATENT DOCUMENTS

| | | | |
|---|---|---|---|
| 8,640,538 B2 * | 2/2014 | Kono | G01F 1/6845 |
| | | | 73/204.26 |
| 8,714,008 B2 * | 5/2014 | Sakuma | G01F 1/6845 |
| | | | 73/379.01 |
| 8,969,977 B2 * | 3/2015 | Kono | G01F 1/684 |
| | | | 257/415 |
| 9,134,153 B2 * | 9/2015 | Matsumoto | G01F 1/692 |
| 9,851,233 B2 | 12/2017 | Sakuma | |
| 2002/0092349 A1 | 7/2002 | Watanabe et al. | |
| 2007/0022808 A1 * | 2/2007 | Tanaka | G01F 1/6845 |
| | | | 73/170.09 |
| 2008/0148842 A1 * | 6/2008 | Oda | G01F 1/6845 |
| | | | 73/204.26 |

* cited by examiner

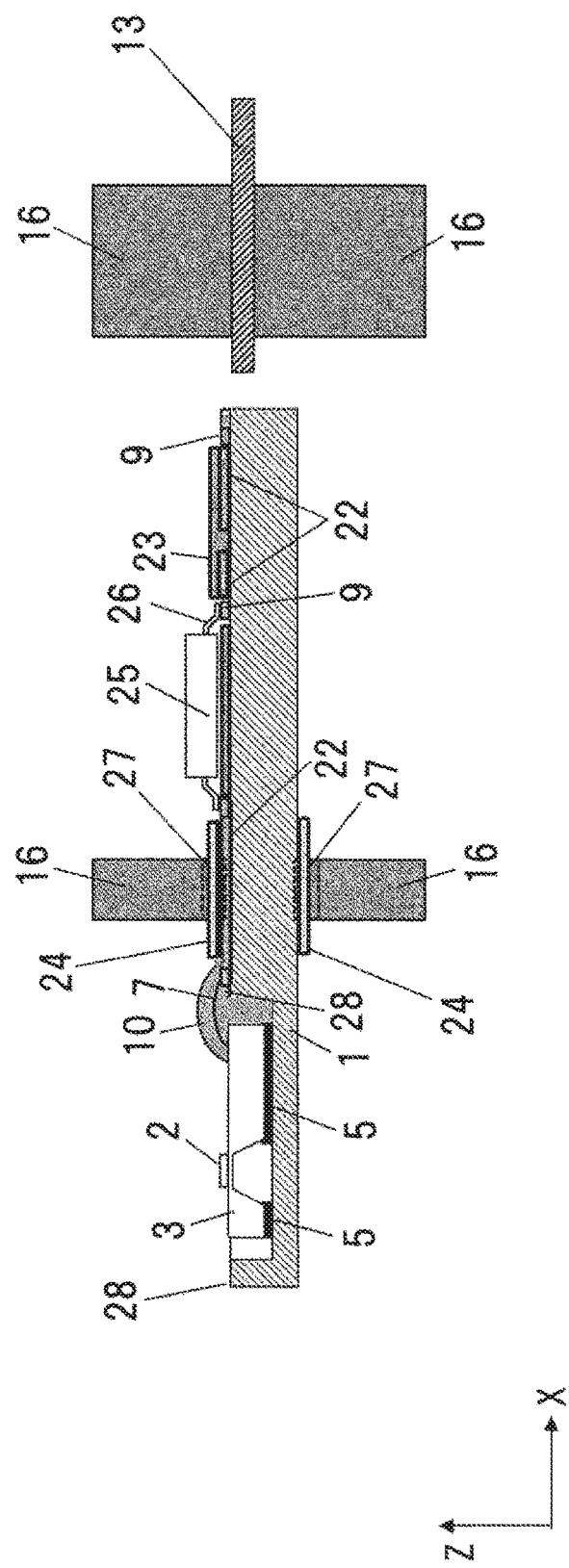

US 10,031,006 B2

SENSOR INCLUDING A PRINTED CIRCUIT BOARD WITH SEMICONDUCTOR PARTS HAVING A FIRST AND SECOND RESIN

TECHNICAL FIELD

The present invention relates to a circuit board mounting structure and a sensor using the same.

BACKGROUND ART

By way of background of the art, there is Japanese Unexamined Patent Application Publication No. 2012-163504 (Patent Literature 1), which describes as follows: "In an air flow measurement device with a structure in which a sensing element for measuring the physical quantity, such as temperature and humidity, is provided on a circuit board in which an electronic circuit is formed, the electronic drive circuit is placed in a housing and the sensing element is exposed to the intake air. At least one or more insulating layers are provided between the circuit board and a glass or resin coated layer. Further, a conductor wiring for connecting the sensing element to the electronic drive circuit is provided below the insulating layer".

CITATION LIST

Patent Literature

Patent Literature 1: Japanese Unexamined Patent Application Publication No. 2012-163504

SUMMARY OF INVENTION

Technical Problem

An object of the present invention is to provide a circuit board structure that can reduce deformation of a circuit board in insert molding of the circuit board.

Solution to Problem

A structure formed by insert molding according to the present invention is an insert molded article that includes a printed circuit board mounted with semiconductor parts, in which the area where the semiconductor parts on the printed circuit board are not mounted is covered with a first resin. A second resin with an elastic modulus smaller than the elastic modulus of the material of the printed circuit board is placed on the outside of the area where the main surface of the printed circuit board overlaps the first resin.

Advantageous Effects of Invention

According to the present invention, it is possible to suppress deformation and crack of a circuit board when the circuit board is formed by insert molding.

BRIEF DESCRIPTION OF DRAWINGS

FIG. 15 is a cross-sectional view showing a mounting structure of the circuit board in which the housing is formed in the circuit module according to the fourth embodiment of the present invention.

DESCRIPTION OF EMBODIMENTS

Currently, the internal combustion engine of a car or vehicle is provided with modules including an electronic circuit, such as a sensor, an engine control unit, and an electronic control throttle. For these modules, a circuit board on which semiconductor parts are mounted is used. The circuit board is accommodated within a housing. In the conventional approach, the circuit board on which the semiconductor parts are mounted has been secured to a plastic housing by bonding with an adhesive. However, this method requires a process of applying and curing the adhesive, which reduces the throughput of the module manufacturing process. Thus, there is also another method called insert molding.

Insert molding is the method of placing a circuit board within a mold in such a way that the circuit board is secured by pouring resin around the perimeter of the circuit board to form a plastic housing. In the method of insert molding, melting resin is directly brought into contact with the circuit board, so that the circuit board can be bonded to the housing simultaneously when the resin is solidified. In this way, it is possible to simplify the bonding process. Here, when the housing resin is brought into contact with the semiconductor parts on the circuit board, a load due to shrinkage of the resin can be easily applied to the semiconductor as well as the joint portion of the semiconductor parts and the circuit board. For this reason, the housing should be formed by pouring resin in such a way that the mounting area of the semiconductor parts is enclosed by the mold so that the mounting area and the peripheral board are not covered with the resin. However, this method blocks the resin by pressing the mold against the board. Thus, there is a risk that the board may be deformed by stress from the mold and deformation and crack may occur in the board.

First Embodiment

In the following embodiment, as an example of the insert molding using a board, an intake air flow sensor is described which is mounted on the internal combustion engine of a car. The intake air flow sensor is the flow sensor for measuring the flow rate of gas (air), which is provided to help control the intake air flow by an electronic fuel injector that is mounted on the internal combustion engine. The intake air flow sensor uses a sensor chip with a thin-walled diaphragm, in which the data measured by the sensor chip is collected and adjusted by a control chip and is output to the outside.

Hereinafter, the first embodiment will be described with reference to the drawings.

Figure 1:
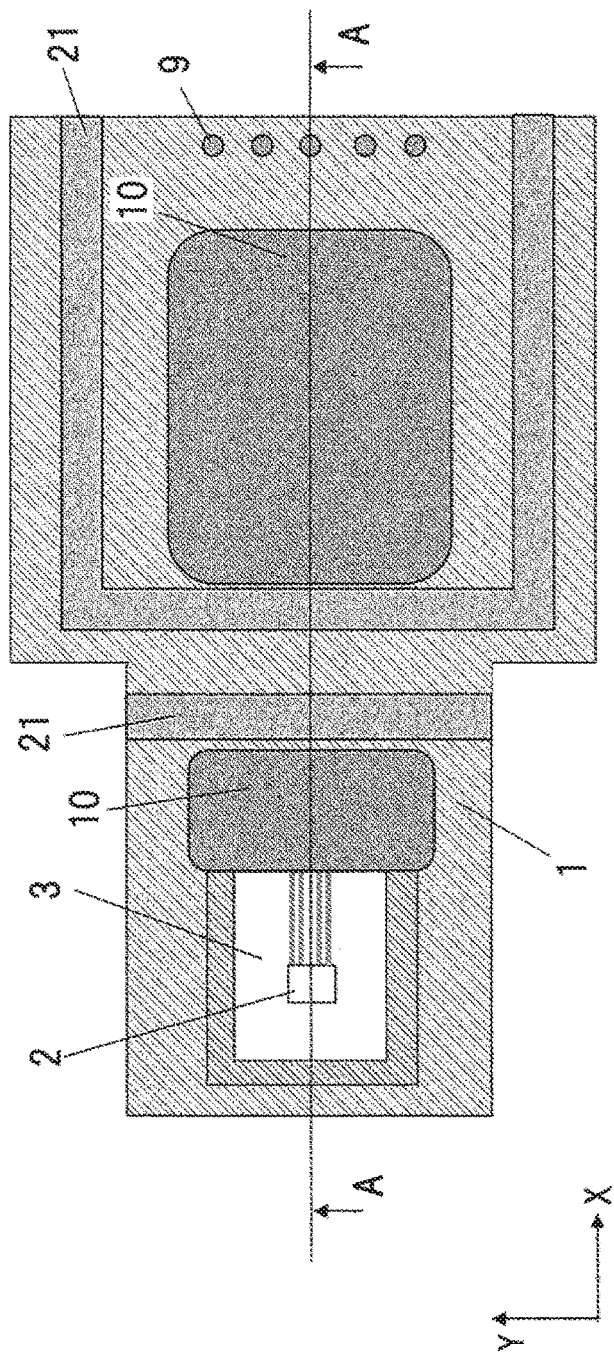
FIG. 1 is a view of a mounting structure of a circuit module according to a first embodiment of the present invention.
Figure 2:
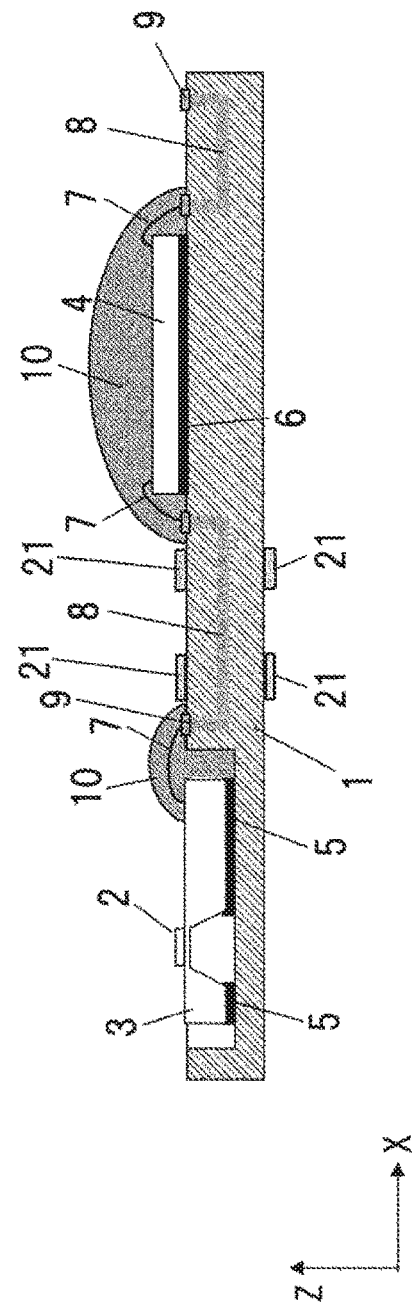
FIG. 2 is a cross-sectional view taken along line A-A of FIG. 1 with respect to the circuit module according to the first embodiment of the present invention.

FIG. 1 shows a circuit module mounted with a semiconductor chip having a control circuit and the like. FIG. 2 is a cross-sectional view of the semiconductor chip taken along line A-A of FIG. 1, showing the mounting structure of the circuit module.

In FIG. 2, the circuit module is mounted with a first semiconductor chip 3 including a diaphragm 2 on a printed circuit board 1 of a material which is, for example, a lamination of Glass fiber and resin, as well as a second semiconductor chip 4 including a control circuit. The printed circuit board 1 and the first semiconductor chip 3 are attached with a first adhesive 5. Further, the printed circuit board 1 and the second semiconductor chip 4 are attached with a second adhesive 6. Inside the printed circuit board 1, a wiring 8 and a wire pad 9 for the conductor wiring are formed. The first semiconductor chip 3 and the second semiconductor chip 4 are connected by a wire 7, the wiring 8, and the wire pad 9. Further, the second semiconductor chip 4 is connected to the wiring 8 by the wire 7. A potting 10 is provided in order to protect the wire 7.

For example, thermosetting resin such as epoxy resin and polyurethane resin, as well as thermoplastic resin such as polyimide and acrylic resin can be used for the first adhesive 5 bonding the printed circuit board 1 to the first semiconductor chip 3, the second adhesive 6 bonding the printed circuit board 1 to the second semiconductor chip 4, and the potting 10 for the protection of the wire 7. At the same time, a filler such as glass or mica can be mixed in the resin.

With respect to the mounting structure of the circuit module described above, a manufacturing method for bonding the circuit module to the housing while the area where the semiconductor parts are mounted is exposed.

Figure 3:
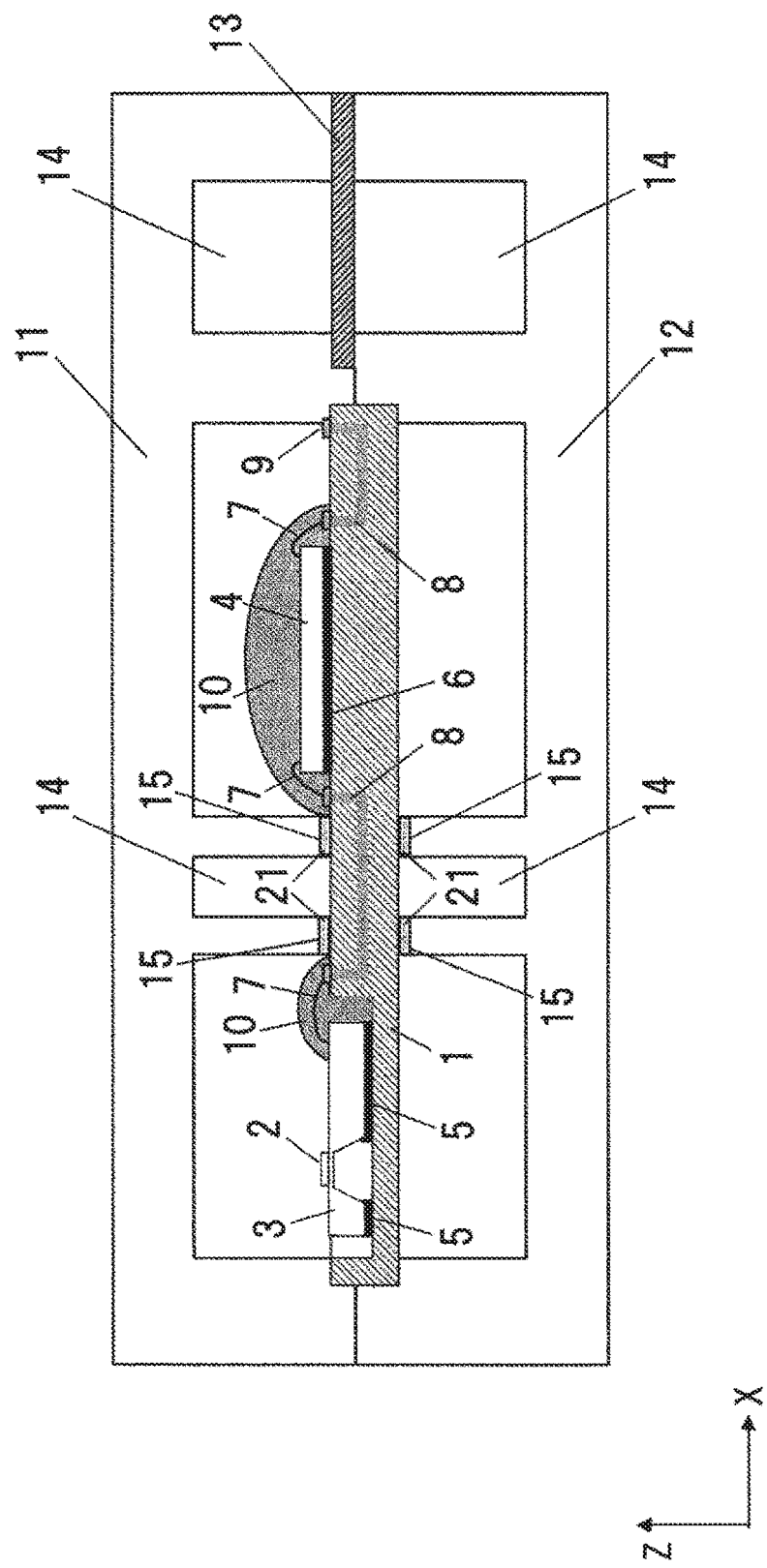
FIG. 3 is a cross-sectional view showing a mold structure for forming a housing in the circuit module to secure the circuit module according to the first embodiment of the present invention.

FIG. 3 shows the mold structure for molding the circuit module while exposing the area where the semiconductor parts are mounted. The mounted circuit module and a connector lead 13 are placed into a mold including an upper mold 11 and a lower mold 12, in which a hollow portion 14 is formed by clamping the circuit module by a clamp portion 15 of the mold. Then, a resin 16 is injected into the hollow portion 14.

Figure 4:
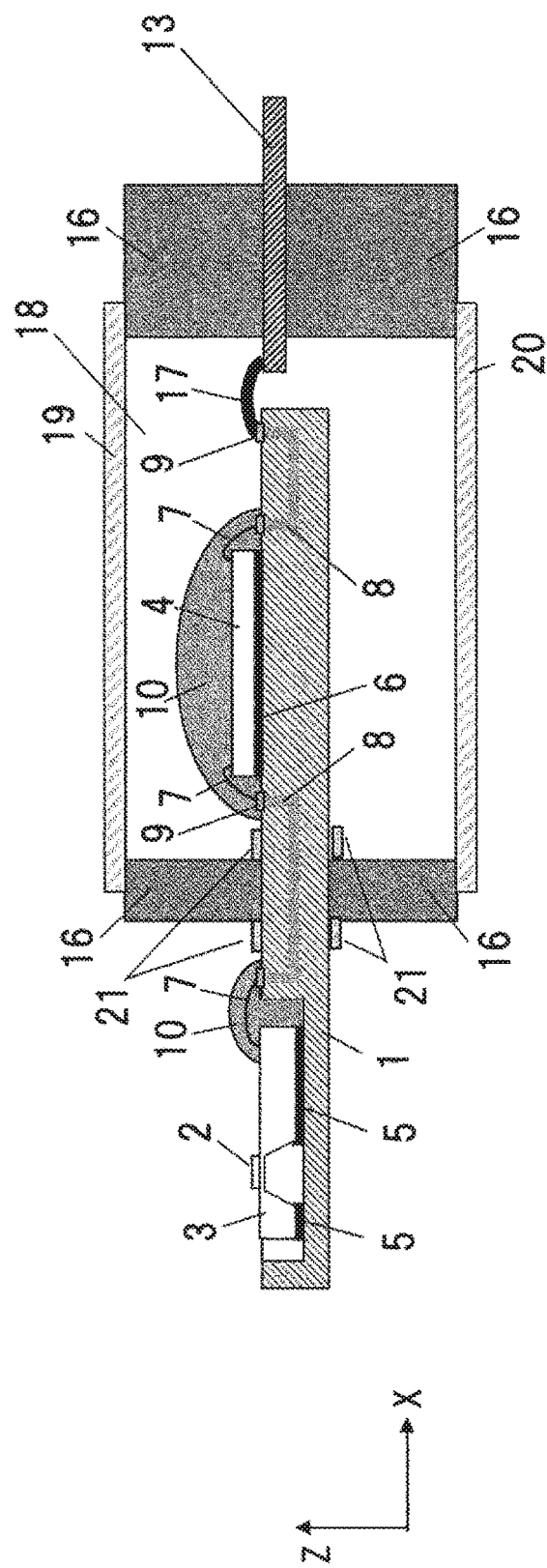
FIG. 4 is a cross-sectional view showing a mounting structure of a circuit board in which the housing is formed in the circuit module according to the first embodiment of the present invention.
Figure 14:
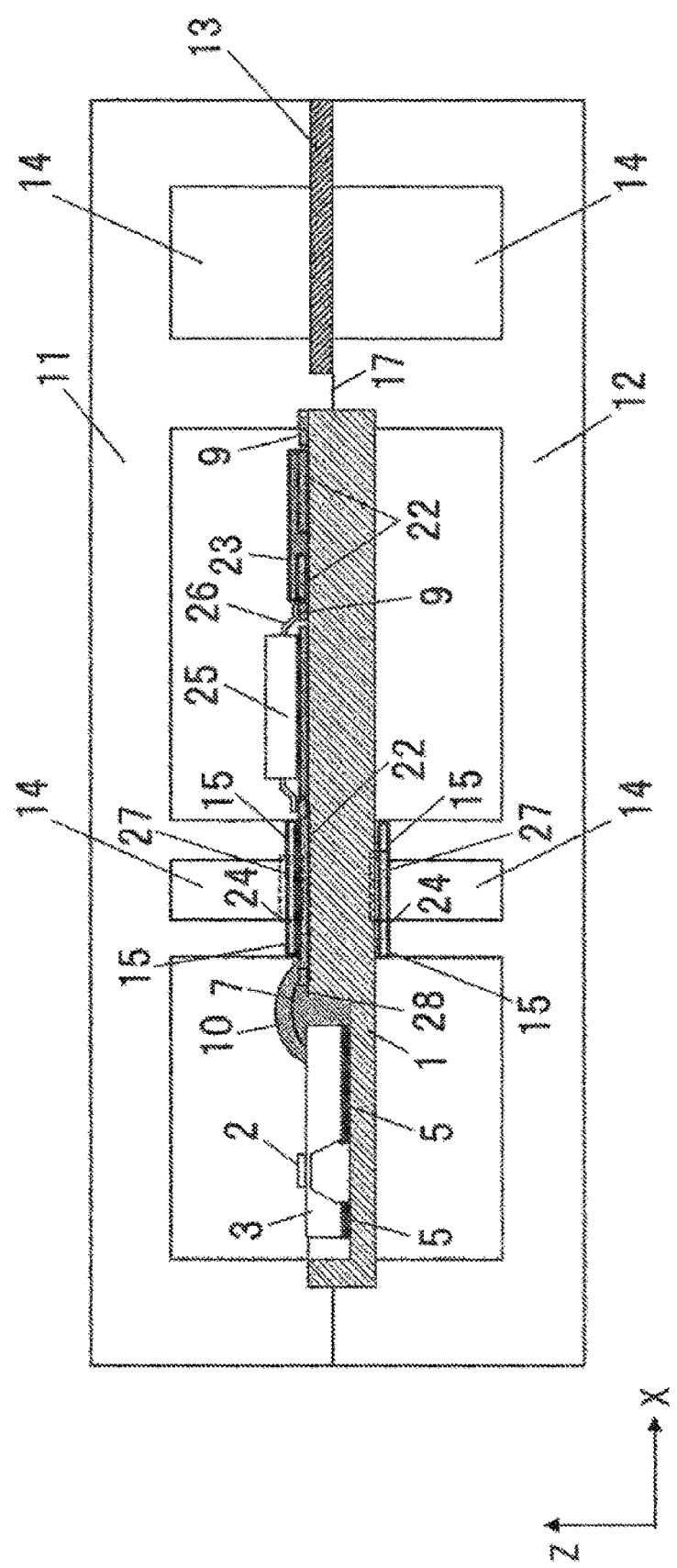
FIG. 14 is a cross-sectional view showing a mold structure for forming a housing in the circuit module to secure the circuit module according to the fourth embodiment of the present invention.

Next, as shown in FIG. 14, the wire pad 9 of the circuit module is connected to the connector lead 13 by a wire 17. As shown in FIG. 4, in order to protect a circuit chamber 18 which is a space including the wire 17, an upper cover 19 and a lower cover 20 are bonded to the top and bottom of the circuit chamber 18, respectively. By the process described above, the circuit module and the housing are bonded together while the semiconductor parts on the circuit module are exposed, to complete the sensor module capable of outputting the detected signal from the circuit module to the outside.

Here, the problem of the conventional insert molding as well as the features of the present embodiment will be described. When the circuit module is insert molded, the printed circuit board 1 should be clamped in the clamp portion 15 of the mold so that the resin 16 does not flow to the semiconductor parts. At this time, if the load of the clamp portion 15 is excessive, deformation will occur in the printed circuit board 1. Further, if the thickness of the printed circuit board 1 varies and increases in the manufacturing process, the deformation could be further increased. In the conventional approach, nothing is placed in the position of the clamp portion 15, and the molding resin is injected into the mold that is in direct contact with the printed circuit board 1. In the present embodiment, as shown in FIGS. 3 and 4, a member 21 with an elastic modulus smaller than the average elastic modulus of the printed circuit board 1 is added to the clamp portion 15 on the printed circuit board 1. As shown in FIG. 3, the housing is formed by injecting the resin 16 into the hollow portion 14 while clamping the area where the member 21 of the circuit module by the clamp portion 15 using the upper mold 11 and the lower mold 12. At the same time, the circuit module and the housing are bonded together.

The elastic modulus herein is the proportionality constant E when Hooke's law stating that the stress in an elastic body and the deformation are proportional to each other is expressed such that "the stress $\sigma$ is proportional to the deformation $\varepsilon$, i.e., $\sigma = E\varepsilon$.

For example, it is desirable to compare the elastic modulus of the member 21 with the elastic modulus of the printed circuit board 1 at the temperature 25° C. (room temperature). Further, the comparison of the elastic modulus can be performed between the elastic modulus of the member 21 and the elastic modulus of the base material of the printed circuit board 1.

In the above description, the comparison of the elastic modulus is made between the member 21 and the printed circuit board 1, the principle of which is that the member 21 whose hardness is softer than that of the printed circuit board 1 is used. The hardness herein can be compared with Vickers hardness, Micro Vickers hardness, Brinell hardness, or Rockwell hardness at room temperature.

For the member 21, for example, thermosetting resin such as epoxy resin and polyurethane resin or thermoplastic resin such as polyimide and acrylic resin can be used as long as it satisfies the requirement described above. At the same time, a filler such as glass or mica can be mixed in the resin.

In this manner, it is possible to reduce the load applied by the mold to the circuit board by the member 21 in the insert molding process. As a result, it is possible to reduce the occurrence of deformation in the printed circuit board 1.

Second Embodiment

Next, a description is given of a case where a wiring protective resist is placed on the wiring in the printed circuit board 1 of the first embodiment.

Figure 5:
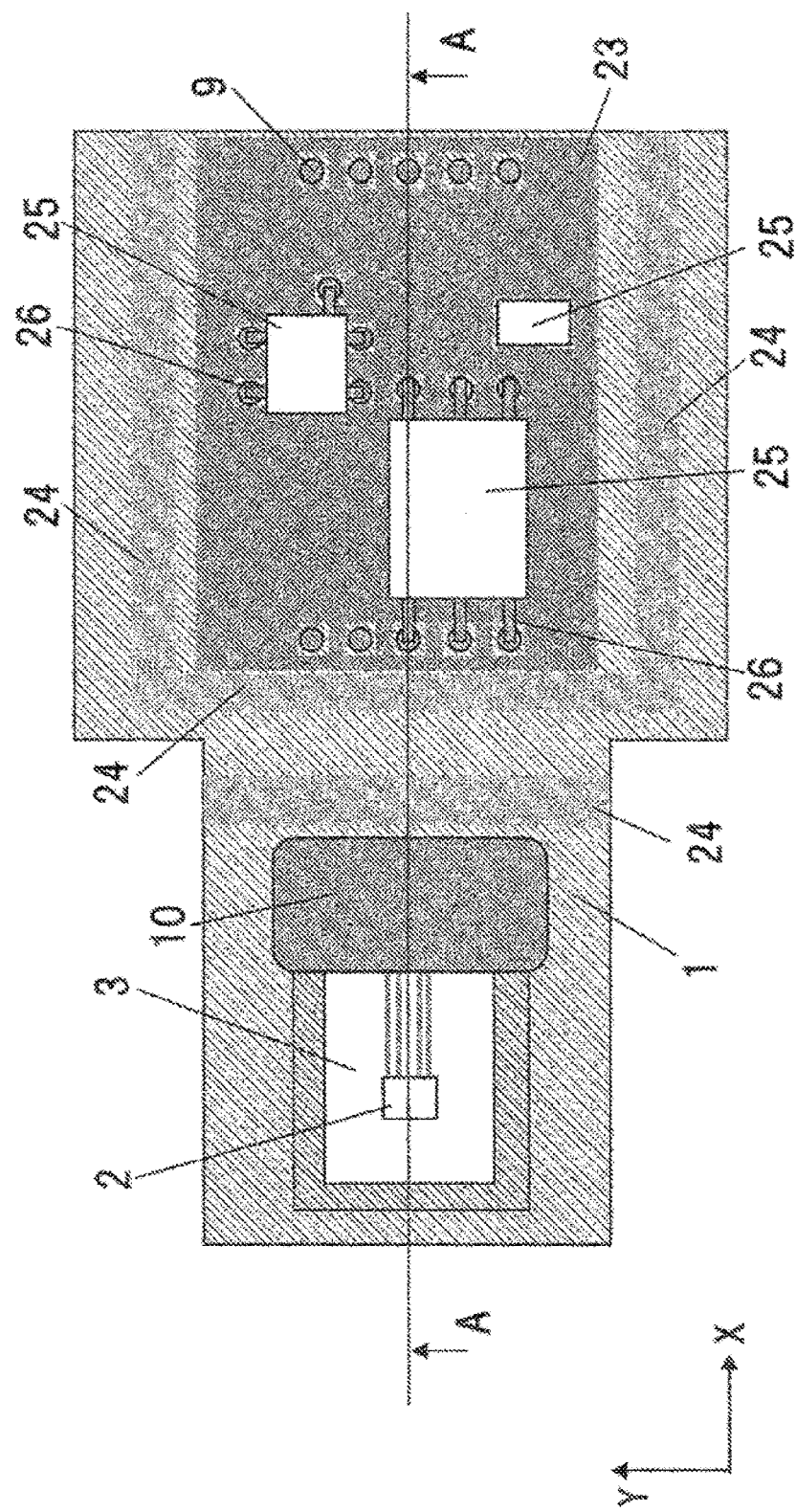
FIG. 5 is a view of a mounting structure of a circuit module according to a second embodiment of the present invention.
Figure 6:
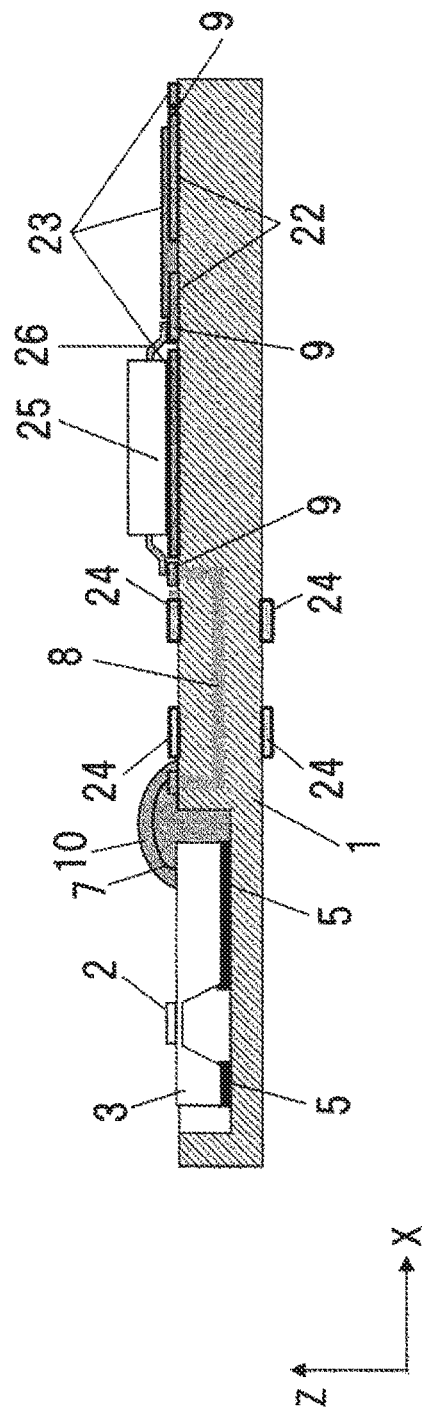
FIG. 6 is a cross-sectional view taken along line A-A of FIG. 5 with respect to the circuit module according to the second embodiment of the present invention.
Figure 7:
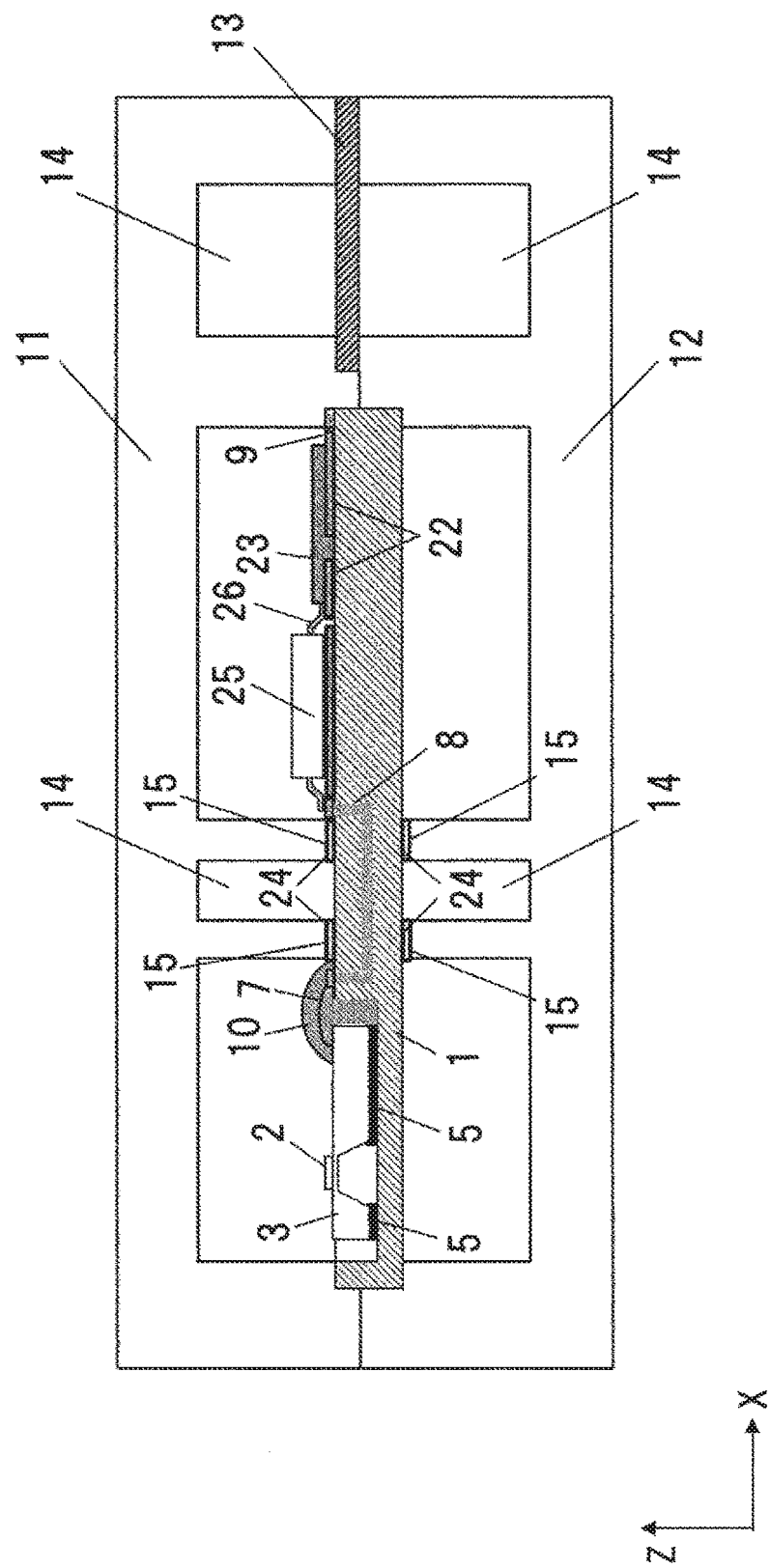
FIG. 7 is a cross-sectional view showing a mold structure for forming a housing in the circuit module to secure the circuit module according to the second embodiment of the present invention.

In FIG. 5, the wiring 8 embedded in the printed circuit board 1 in FIG. 1 is formed on the board, in which a wiring protective resist 23 is provided in order to protect the wiring 8.

The member 21 can also be applied to the configuration of the circuit board shown in FIG. 5. In this case, it is possible to use the same material as the wiring protective resist 23 as long as it satisfies the requirement that the elastic modulus of the member 21 is lower than the elastic modulus of the circuit board. In this embodiment, the member 21 can be placed at one time in the installation process of the wiring protective resist 23. As a result, the bonding process can be simplified

Third Embodiment

Figure 8:
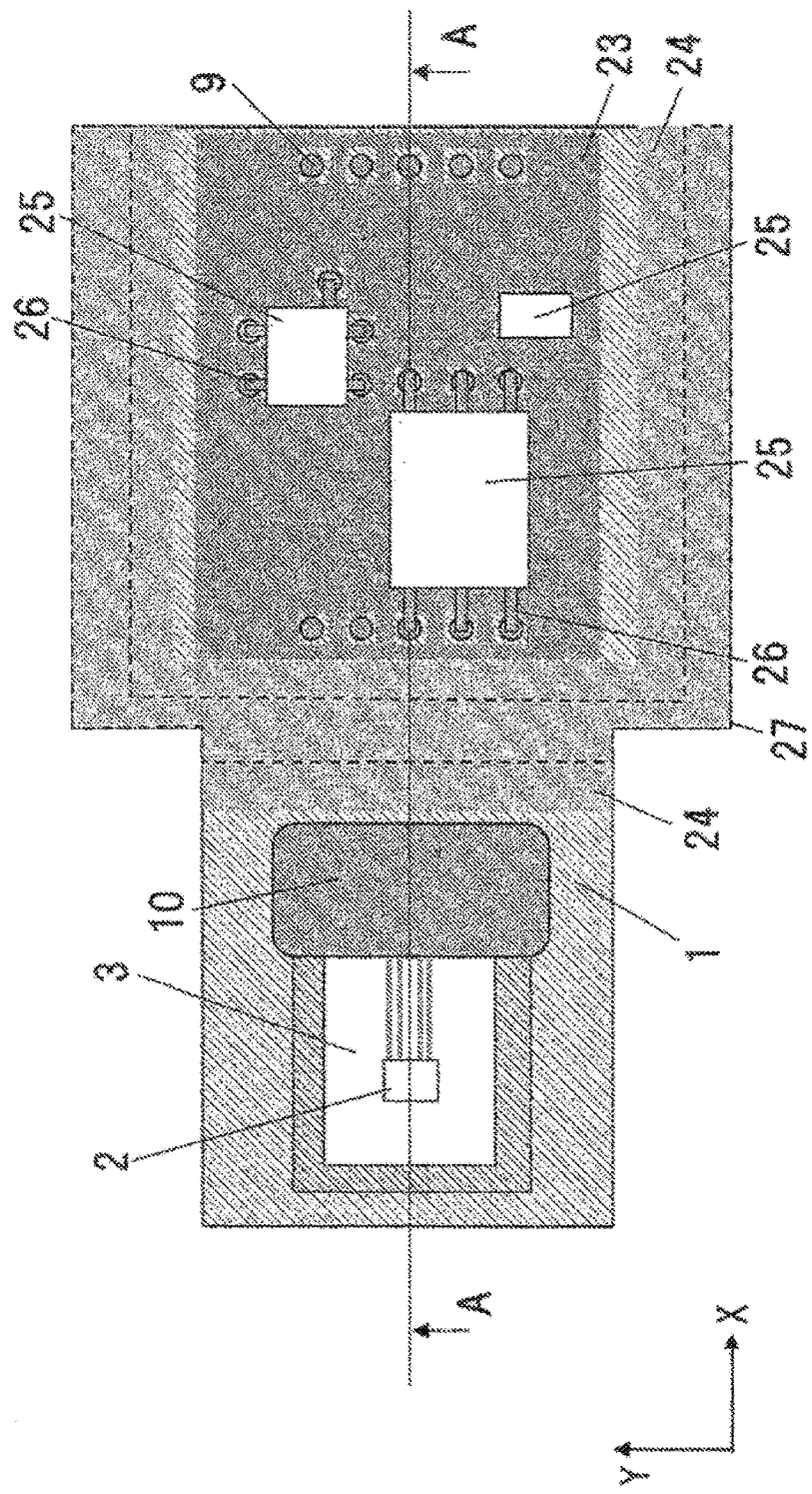
FIG. 8 is a view of a mounting structure of a circuit module according to a third embodiment of the present invention.
Figure 9:
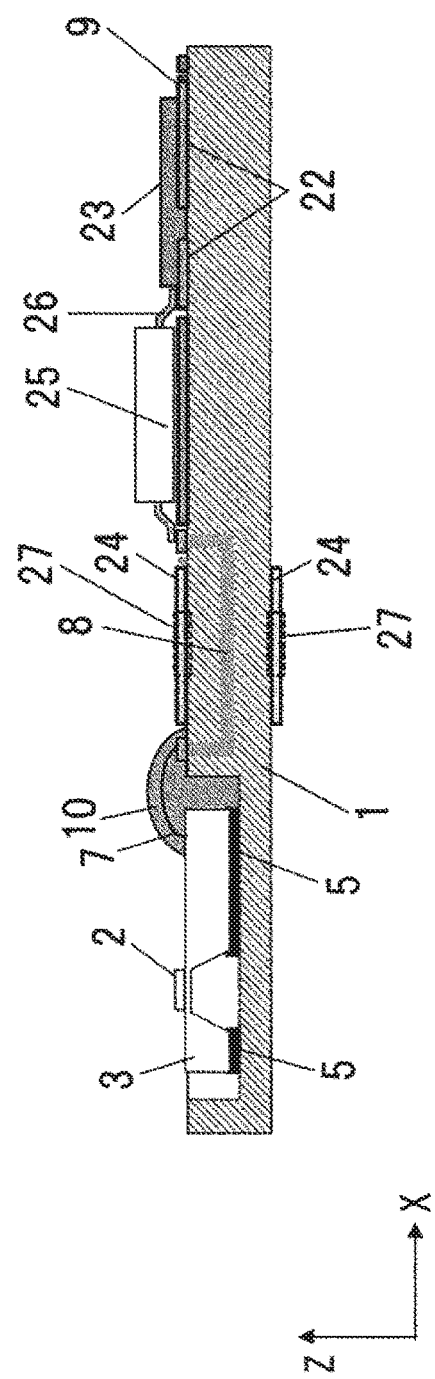
FIG. 9 is a cross-sectional view taken along line A-A of FIG. 8 with respect to the circuit module according to the third embodiment of the present invention.
Figure 10:
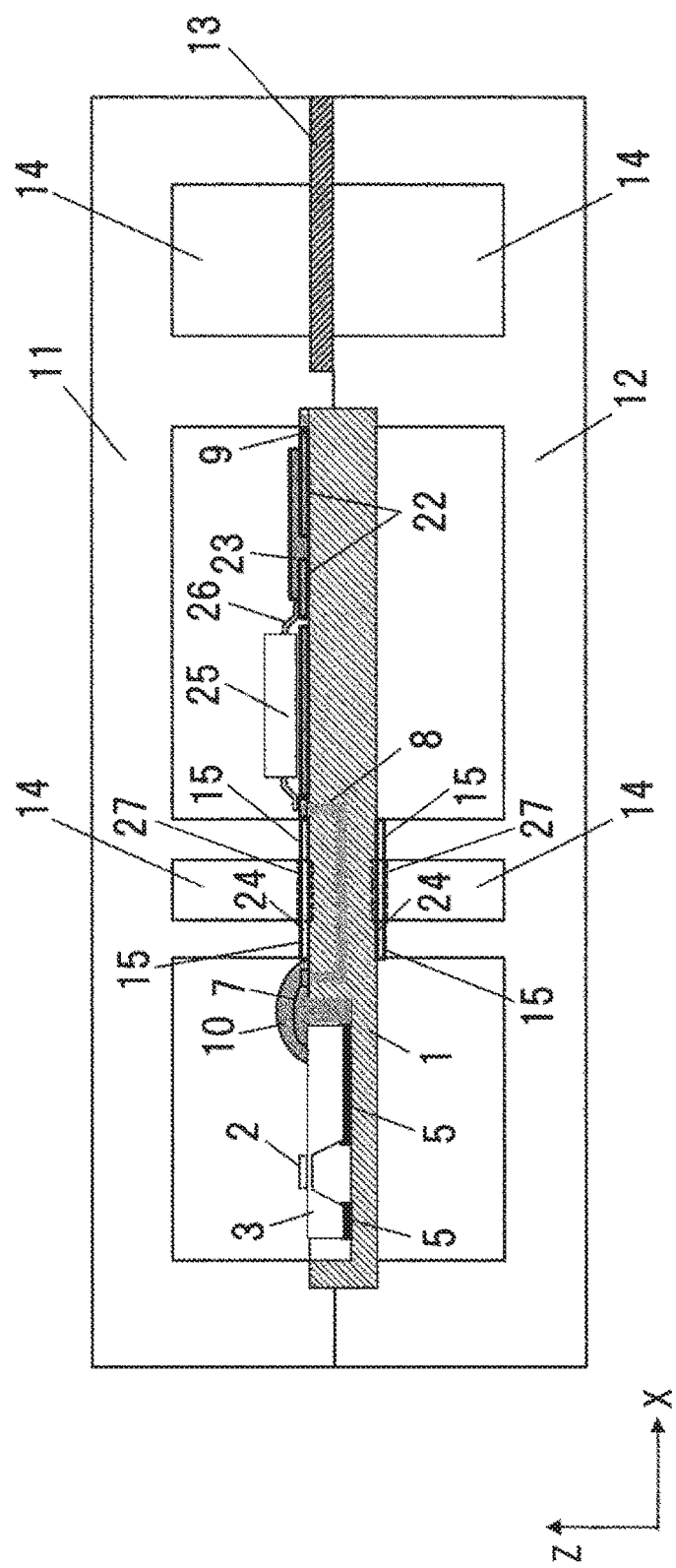
FIG. 10 is a cross-sectional view showing a mold structure for forming a housing in the circuit module to secure the circuit module according to the third embodiment of the present invention.
Figure 11:
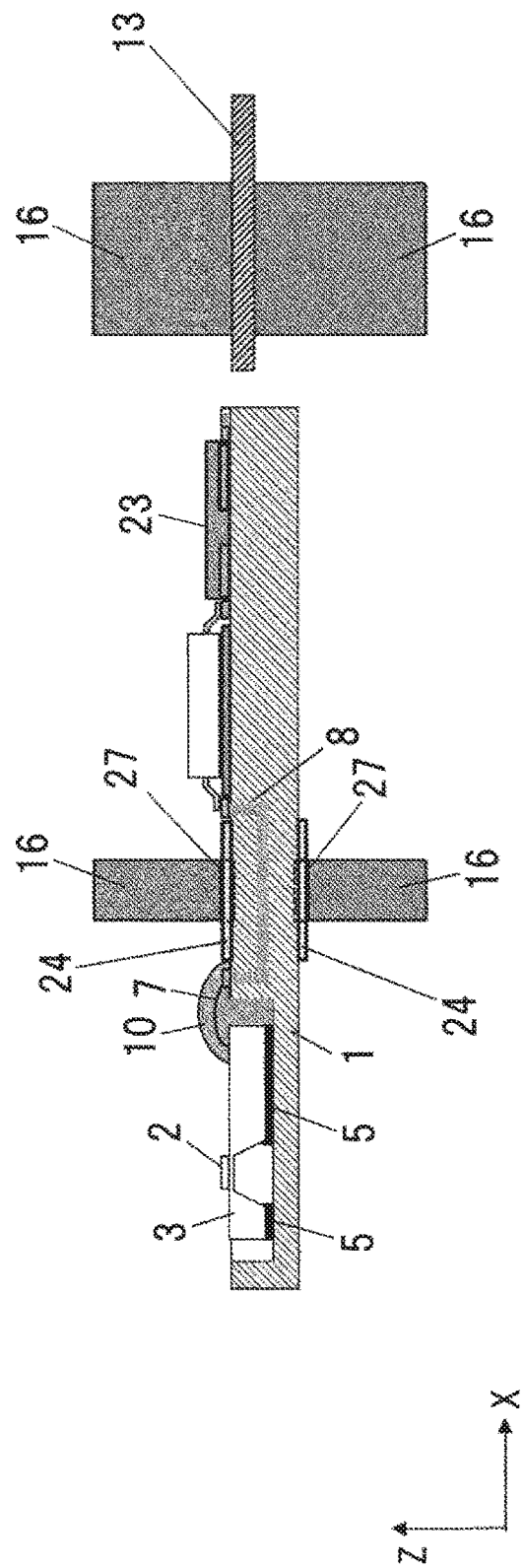
FIG. 11 is a cross-sectional view of a mounting structure of the circuit board in which the housing is formed in the circuit module according to the third embodiment of the present invention.
Figure 12:
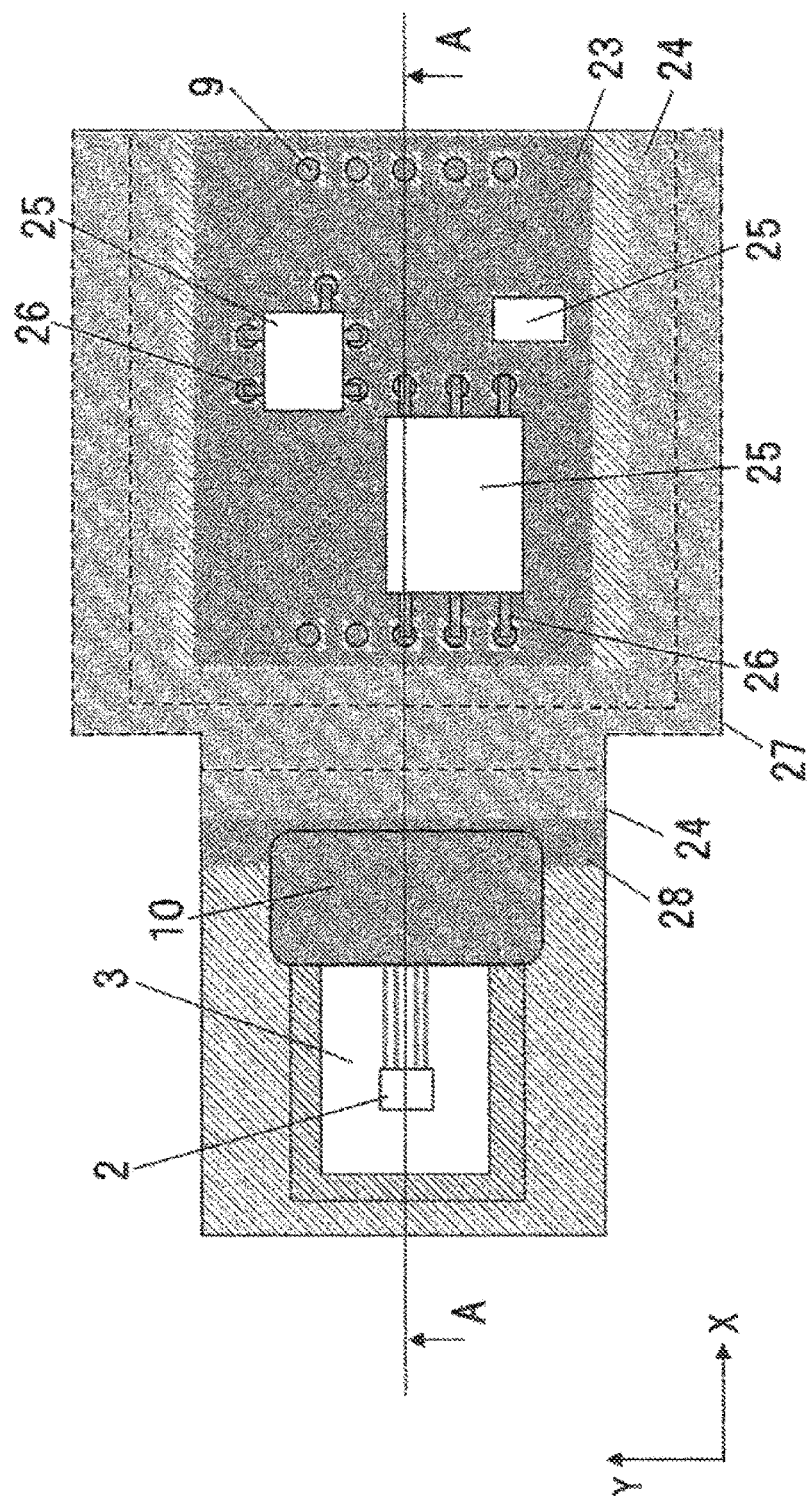
FIG. 12 is a view of a mounting structure of a circuit module according to a fourth embodiment of the present invention.
Figure 13:
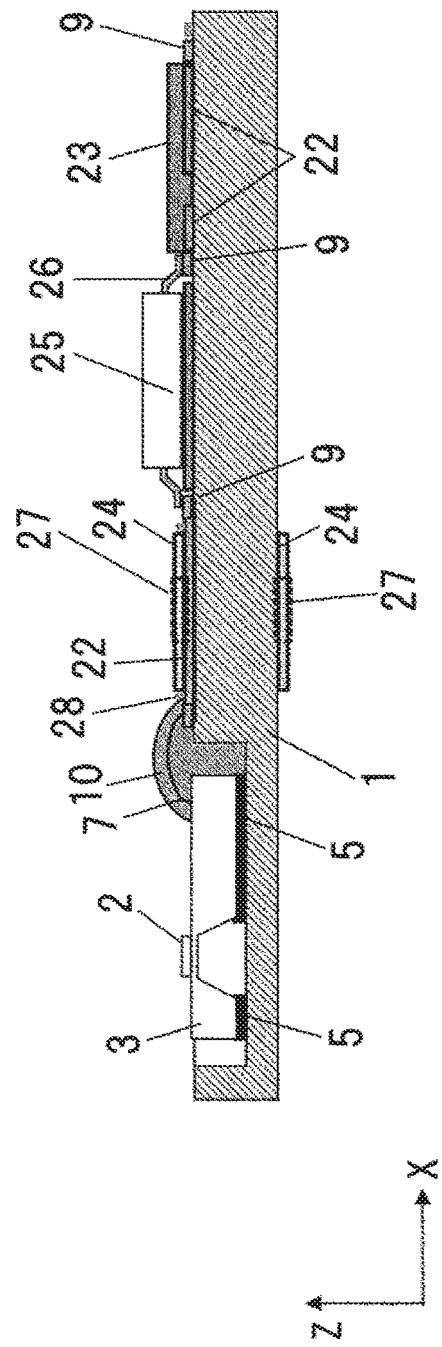
FIG. 13 is a cross-sectional view taken along line A-A of FIG. 12 with respect to the circuit module according to the fourth embodiment of the present invention.

The mounting structure of a circuit module of a third embodiment is shown in FIG. 8. The third embodiment significantly differs from the first and second embodiments in that a member 24, which corresponds to the member 21 in the first and second embodiments, is also added to the area of the joint portion 27 shown in FIGS. 8 to 11.

In FIG. 8, a third semiconductor chip 25 is connected to the wire pad 9 by an outer lead 26 that is derived from the third semiconductor chip 25. With respect to this mounting structure, insert modeling is performed in order to bond the circuit module to the housing while exposing the area where the semiconductor parts of the circuit module are mounted. The member 24 is placed on the main surface of the circuit board 1 in the area where the circuit board 1 overlaps the mold clamp portion 15 as well as the area including the joint portion 27 of the circuit board and the resin.

According to this embodiment, there is no need to accurately place the member 24 in the contact area of the mold, so that the placement of the member 24 is easy compared to the first and second embodiments. Thus, it is possible to improve deterioration of the yield. In addition, it is possible to reduce the thermal stress generated after molding due to the difference in the linear expansion coefficient between the circuit board 1 and the resin 16 by placing the member 21 in the joint portion 27. As a result, it is possible to reduce the deformation of the circuit board and to prevent separation of the joint portion.

Fourth Embodiment

The present embodiment illustrates a circuit board in which a conductor wiring 22 is placed also in the clamp portion 15 and the joint portion 27, to which the present invention is applied.

Like the second and third embodiments, the wiring protective resist 23 is placed in the area except the wire pad 9 of the conductor wiring 22 and in the area 28 where the conductor wiring is exposed. In addition, in the present embodiment, the conductor wiring 22 is also placed in the clamp portion 15 and the joint portion 27. Further, the member 24 is also placed over the conductor wiring 22 that is placed in the clamp portion 15 and the joint portion 27.

With respect to such a mounting structure, insert modeling is performed in order to bond the circuit module to the housing while exposing the area 28 where the semiconductor parts of the circuit module are mounted. The procedure of the insert molding using the mold is the same as the procedure described in the first to third embodiments. According to this embodiment, since the member 24 is placed over a wide range like the third embodiment, there is no need to accurately place the member 24 in the contact area of the mold, so that the placement of the member 24 is easy compared to the first and second embodiments. Thus, it is possible to improve deterioration of the yield. In addition, it is possible to reduce the thermal stress generated after molding due to the difference in the linear extension coefficient between the printed circuit board 1 and the resin 16. As a result, it is possible to reduce the deformation of the circuit board and to prevent separation of the joint portion.

The above description illustrates an example of the component in which the intake air flow sensor is insert molded. However, the present invention is not limited only to this example, and it can be used for any component in which a circuit board, especially, a printed circuit board is insert molded.

The invention made by the present inventors has been concretely described based on the embodiments. However, it is needless to say that the present invention is not limited to the above embodiments and various modifications and alterations can be made within the scope of the present invention.

LIST OF REFERENCE SINGS

1 . . . printed circuit board, 2 . . . diaphragm, 3 . . . first semiconductor chip, 4 . . . second semiconductor chip, 5 . . . first adhesive, 6 . . . second adhesive, 7 . . . wire, 8 . . . conductor wiring, 9 . . . wire pad, 10 . . . potting, 11 . . . upper mold, 12 . . . lower mold, 13 . . . connector lead, 14 . . . hollow portion, 15 . . . clamp portion, 16 . . . resin, 17 . . . wire, 18 . . . circuit chamber, 19 . . . upper cover, 20 . . . lower cover, 21 . . . member, 22 . . . conductor wiring, 23 . . . wiring protective resist, 24 . . . member, 25 . . . third semiconductor chip, 26 . . . outer lead, 27 . . . joint portion, 28 . . . area where the conductor wiring is exposed

The invention claimed is:
1. A sensor comprising:
a printed circuit board;
a first member that is bonded to the printed circuit board and orthogonal to the printed circuit board, wherein the first member is formed from a first resin;
one or more second members formed adjacent to the first member on the printed circuit board, wherein the one or more second members are formed from a second resin; and
an upper cover that is parallel to the printed circuit board and attached to the first member;
a lower cover that is parallel to the printed circuit and attached to the first member;
a circuit chamber formed from the first member, the upper cover, and the lower cover; and
semiconductor parts mounted on the printed circuit board, wherein at least one of the semiconductor parts is located within the circuit chamber;
wherein the second resin has an elastic modulus smaller than an elastic modulus of the printed circuit board.
2. The sensor according to claim 1, wherein the semiconductor parts include a semiconductor for flow sensing.
3. The sensor according to claim 1, wherein the second resin is of a same material that is placed on conductor wiring formed on the printed circuit board.

4. The sensor according to claim 1, wherein the sensor is formed by insert molding.

\* \* \* \* \*